(12) United States Patent
Melnick et al.

(10) Patent No.: US 6,235,603 B1
(45) Date of Patent: May 22, 2001

(54) METHOD FOR FORMING A SEMICONDUCTOR DEVICE USING AN ETCH STOP LAYER

(75) Inventors: Bradley M. Melnick, Austin, TX (US); Hideo Oi, Sendai (JP); Bruce E. White, Jr., Round Rock, TX (US); Robert Edwin Jones, Austin, TX (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/351,442

(22) Filed: Jul. 12, 1999

(51) Int. Cl.[7] ............... H01L 21/20; H01L 21/8242

(52) U.S. Cl. ............... 438/393; 438/253; 438/254; 438/396; 438/397

(58) Field of Search ............... 438/253–256, 438/381, 393–399; 257/306–309, 310

(56) References Cited

U.S. PATENT DOCUMENTS

| | | | |
|---|---|---|---|
| 5,681,773 | 10/1997 | Tseng | 437/52 |
| 5,717,250 | * 2/1998 | Schuele et al. | 257/754 |
| 5,786,259 | 7/1998 | Kang | 438/396 |
| 5,920,790 | * 7/1999 | Wetzel et al. | 438/618 |
| 6,083,789 | * 7/2000 | Huang et al. | 438/254 |

OTHER PUBLICATIONS

Wolf S., "Silicon Processing for the VLSI Era", vol. 2, Lattice Press, pp. 273–275, 1990.*

Nakamura et al., A Simple 4 G–bit DRAM Technology Utilizing High–Aspect–Ratio Pillars for Cell–Capacitors and Peripheral–Vias Simultaneously Fabricated, IEDM Technical Digest, pp. 29–32 (1997).

Ishiuchi et al., Embedded DRAM Technologies, IEDM Technical Digest, pp. 33–36 (1997).

Drynan et al., Cylindrical Full Metal Capacitor Technology for High–Speed Gigabit DRAMS, Symposium on VLSI Technology, pp. 151–152 (1997).

* cited by examiner

Primary Examiner—John F. Niebling
Assistant Examiner—Ha Tran Nguyen

(57) ABSTRACT

A first etch stop layer (14) is formed over a semiconductor substrate (10). A first dielectric layer (20) is formed over the first etch stop layer (14). An opening (22) is formed in the first dielectric layer (20). The opening (22) extends through the first dielectric layer (20) and exposes a first conductive material (18) under the first dielectric layer (20). A second conductive material (30) is deposited over the semiconductor substrate (10) and within the opening (22). The second conductive material (30) electrically contacts the first conductive material (18). Portions of the second conductive material (30) lying outside of the opening (22) are removed and then portions of the first dielectric layer (20) are removed to expose portions of the first etch stop layer (14).

17 Claims, 5 Drawing Sheets

METHOD FOR FORMING A SEMICONDUCTOR DEVICE USING AN ETCH STOP LAYER

RELATED APPLICATIONS

This application is related to U.S. patent application Ser. Nos. 09/022,756, filed on Feb. 12,1998; 09/058,935, filed Apr. 13, 1998; 09/064,076, filed Apr. 22,1998; and 09/134,974, filed Aug. 17, 1998, all of which are assigned to the current assignee hereof and are hereby incorporated by reference.

FIELD OF THE INVENTION

The present invention relates generally to a method for forming a semiconductor device, and more particularly, to a method for forming a semiconductor device having an electrode.

BACKGROUND OF THE INVENTION

The scaling of semiconductor devices, such as capacitors in dynamic random access memories (DRAMs), has resulted in the integration of new materials into the fabrication of these devices. Among them include high dielectric constant (high-k) materials, such as barium strontium titanium oxide (BST) and the like. However, many high-k dielectric materials may be incompatible with conventional capacitor electrode materials because they can require high temperature depositions or high-temperature anneals in the presence of oxygen during their formation. The high temperature and exposure to oxygen can oxidize portions of the electrode and undesirably change the electrical properties of the capacitor.

To reduce this problem, alternative materials are being investigated as replacements for conventional electrode materials. Among them include oxidation-resistant conductive materials and conductive materials that form conductive oxides, such as ruthenium, platinum, iridium, palladium, and the like. However, current processes and chemistries used to form electrodes from these materials can be problematic. For example, ruthenium is easily etched in an oxygen-containing plasma, however, its etch by-products can be toxic. Additionally, halogens, which are commonly used to etch conductive materials, produce low volatility etch by-products that make etching materials such as platinum, palladium, and iridium difficult. This difficulty increases as the thickness of the material being etched increases and the spacing between etched features decreases.

Using high-powered etching conditions or alternative processes, such as ion milling to etch the thicker material, results in reduced selectivity to underlying films. This can produce trenching of the underlying material and the re-deposition of the material on sidewalls of the feature being etched. Trenching of underlying films is undesirable because it can impact device performance. The re-deposition of the underlying material on etched feature sidewalls can present reliability concerns. The removal of sidewall deposited material is difficult and is accomplished at the expense of additional processing and time.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiment(s) of the present invention.

DETAILED DESCRIPTION

In accordance with an embodiment of the present invention, a first etch stop layer is formed over a semiconductor substrate and a first dielectric layer is formed over the first etch stop layer. An opening is formed in the first dielectric layer to expose a first conductive material, and a second conductive material is formed over the semiconductor substrate to completely fill the opening. Portions of the second conductive material lying outside of the opening are removed and then portions of the first dielectric layer are removed to expose portions of the first etch stop layer.

Figure 1:
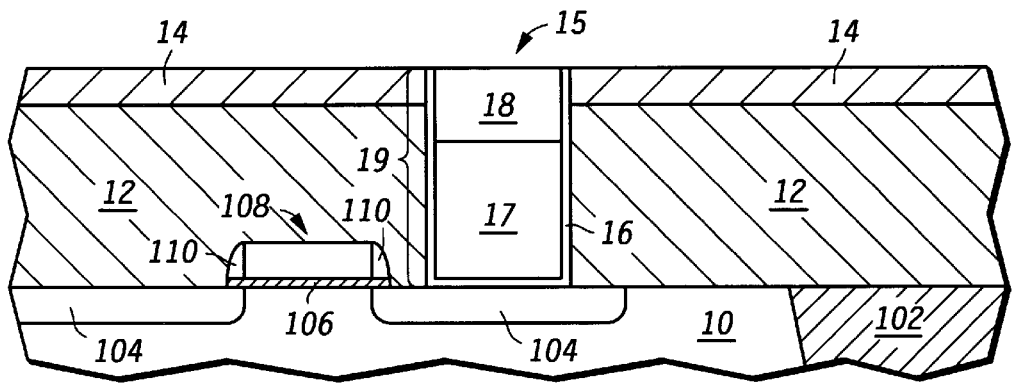
FIGS. 1–7 include illustrations of cross-sectional views of a semiconductor device in accordance with a first set of embodiments.

Embodiments of the present invention will now be described more fully with references to the accompanying figures. FIG. 1 includes an illustration of a cross-sectional view of a portion of a semiconductor device. The semiconductor device includes a semiconductor substrate 10 and trench field isolation regions 102 and doped regions 104 formed within the semiconductor substrate 10. As used in this specification, a semiconductor substrate includes a monocrystalline semiconductor substrate, a semiconductor-on-insulator substrate, or any other substrate used to form a semiconductor device. A gate dielectric layer 106 overlies portions of the semiconductor substrate 10, and a gate electrode 108 and spacers 1 10 overlie the gate dielectric layer 106. The trench field isolation regions 102, doped regions 104, gate dielectric layer 106, gate electrode 108, and spacers 110 can all be formed using conventional materials and processes.

An interlevel dielectric layer (ILD) 12 is formed overlying the gate electrode 108 and the semiconductor substrate 10. In one embodiment, the ILD layer 12 is a layer of plasma-deposited silicon oxide which is formed using tetraethoxysilane (TEOS) as a source gas. Alternatively, ILD layer 12 may be a layer of silicon nitride, a layer of phosphosilicate glass (PSG), a layer of borophosphosilicate glass (BPSG), a silicon oxynitride layer, a thermal oxide layer, a low-k dielectric layer, or a combination thereof. For the purposes of this specification, a low-k dielectric is any dielectric material having a dielectric constant less than approximately 3.5.

An etch stop/hardmask layer 14 is then formed overlying ILD layer 12. In one embodiment, the etch stop/hardmask layer 14 is a layer of silicon nitride deposited using conventional chemical vapor deposition (CVD) methods, such as low pressure CVD (LPCVD) or plasma enhanced CVD (PECVD). Alternatively, the etch stop/hardmask layer 14 can be formed as a layer of silicon oxynitride or any other material capable of being selectively etched with respect to oxide materials. The thickness of etch stop/hardmask layer 14 is typically in a range of approximately 50–100 nanometers (nm).

After depositing the etch stop/hardmask layer 14, patterning and etch processes are used to form a contact opening 15 through the etch stop/hardmask layer 14 and ILD layer 12. A conductive plug 19 is then formed within the contact opening 15. The conductive plug 19 includes an adhesion/barrier layer 16, such as titanium/titanium nitride (Ti/TiN), tantalum/tantalum nitride (Ta/TaN), or the like; a conductive fill material 17, such as tungsten, polysilicon, or the like; and a conductive oxygen barrier material 18, such as iridium.

After the opening 15 is formed, the adhesion/barrier layer 16 is deposited within the opening 15 and then the conductive fill material 17 is deposited to completely fill the opening 15. Portions of the adhesion/barrier layer 16 and conductive fill material 17, lying outside of the opening 15, are then removed using a conventional etch or chemical-mechanical polishing (CMP) process. Up to this point in the process, conventional methods have been used to form the device.

Uppermost portions of the conductive fill material, within the opening 15, are then selectively etched to form a recess (not shown) in the opening 15. The etch is performed using a conventional etching process having adequate selectivity to the adhesion/barrier layer 16. The etch removes approximately 100–250 nm of the conductive fill material 17 from the uppermost portions of the opening 15.

Approximately 350–550 nm of a conductive oxygen barrier material 18 is then deposited over the substrate 10 and within the recessed portion of the contact opening 15. In one embodiment, the conductive oxygen barrier material 18 is deposited using a physical vapor deposition (PVD) process and is formed using iridium. Alternatively, the conductive oxygen barrier material 18 can be deposited using a CVD process or formed with other conductive materials. Other materials suitable for use as an oxygen barrier material include those that are not readily oxidized or those that are capable of forming conductive oxides or nitrides. Examples of these include ruthenium (Ru), iridium oxide (IrO$_2$), ruthenium oxide (ReO$_2$, ReO$_3$), titanium nitride (TiN), titanium aluminum nitride (TiAlN), titanium silicon nitride (TiSiN), tantalum nitride (TaN), tantalum aluminum nitride (TaAlN), tantalum silicon nitride (TaSiN), metal nitrides, metal borides, metal carbides, and the like. Portions of the conductive oxygen barrier material 18, lying outside of the contact opening, are then removed using a conventional etch or CMP processing to form the conductive plug 19, as shown in FIG. 1.

Figure 2:
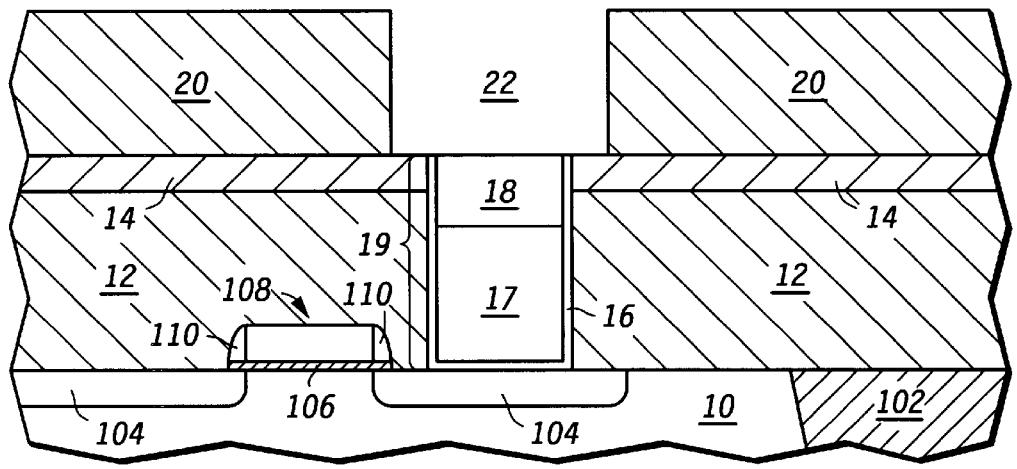

FIG. 2 further includes a dielectric layer 20 formed over the semiconductor substrate 10 and an opening 22 formed within the dielectric layer 20. In one embodiment, the dielectric layer 20 is formed using TEOS. Alternatively the dielectric layer 20 is formed using BPSG, PSG, silicon oxynitride, thermal oxide, polyimide, or a combination thereof. The opening 22 is formed using conventional patterning and etching methods. The opening 22 exposes portions of the underlying conductive plug 19, as shown in FIG. 2. The thickness of dielectric layer 20 and the width of the opening 22 are determined by the dimensions of a lower capacitor electrode, which is subsequently formed.

Figure 3:
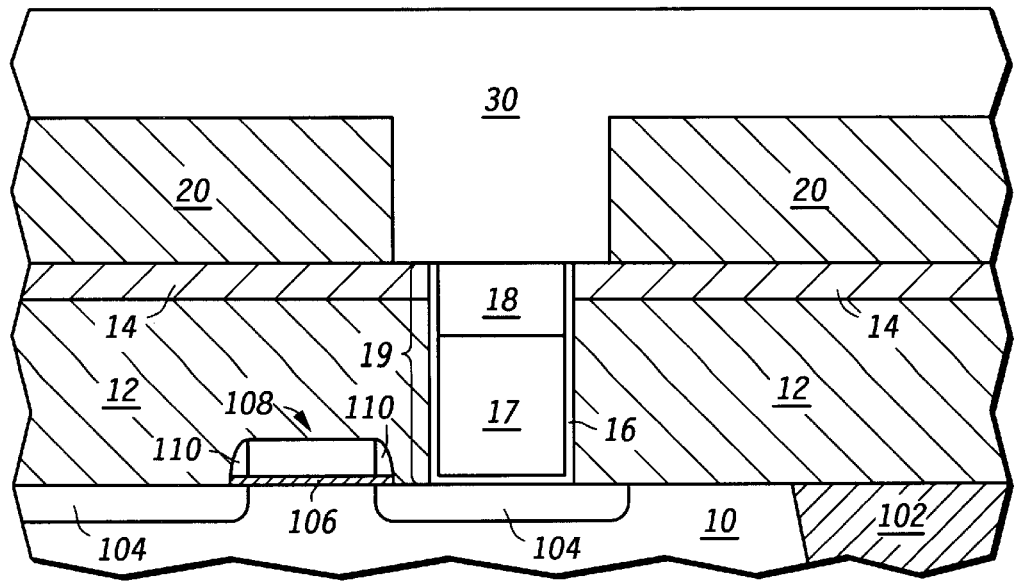

FIG. 3 illustrates that a conductive film 30 is formed over the semiconductor substrate 10. The thickness of the conductive film 30 is such that it substantially fills the opening 22. In one embodiment, PVD sputtered iridium is used to form the conductive film 30. Alternatively, conductive film 30 can be formed using other oxygen resistant conductive materials, such as platinum (Pt), palladium (Pd), and the like; conductive materials that are capable of forming conductive oxides, such as ruthenium (Ru), rhenium (Re), rhodium (Rh), osmium (Os), and the like; and conductive metal oxides, such as ruthenium oxide (RuO$_2$), rhenium oxide (ReO$_2$, ReO$_3$), iridium oxide (IrO$_2$), osmium oxide (OsO$_2$), and the like, or combinations thereof. Alloys or composite of these conductive materials can also be used. These can include combinations, such as Pt-Ti, Pt-Pd, Pt-Ir, and the like. Other materials suitable for use as the conductive film 30 include strontium ruthenate (SrRuO$_3$), lanthanum strontium cobalt oxide (LSCO), yttrium barium copper oxide (YBCO), and the like. The conductive film 30 can also alternatively be formed using other deposition methods including CVD, electroplating, and electroless plating.

Figure 4:
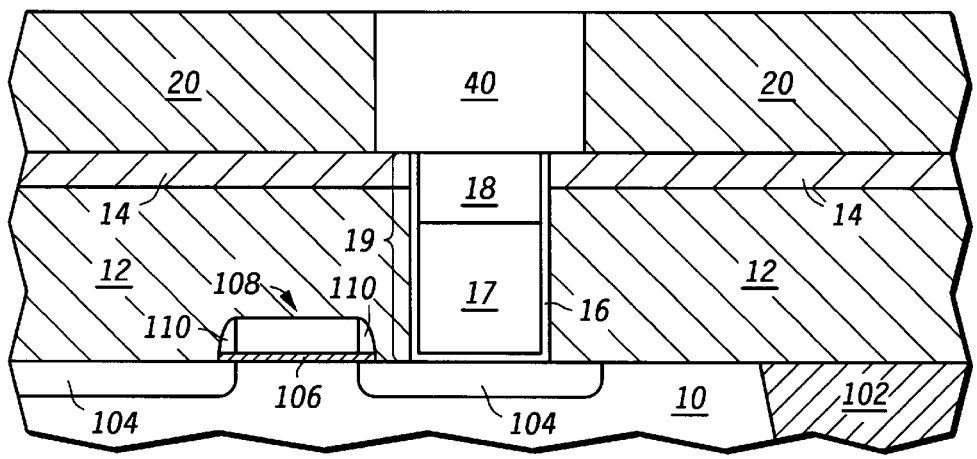

FIG. 4 further illustrates the cross-section of FIG. 3 after removing portions of the conductive film 30 lying outside of the opening 22. The portions of conductive film 30 are removed using conventional etch or polishing techniques. After removing the portions of conductive film 30, a lower electrode 40 of a capacitor having dimensions determined by the opening 22 in the dielectric layer 20 has been substantially defined.

Figure 5:
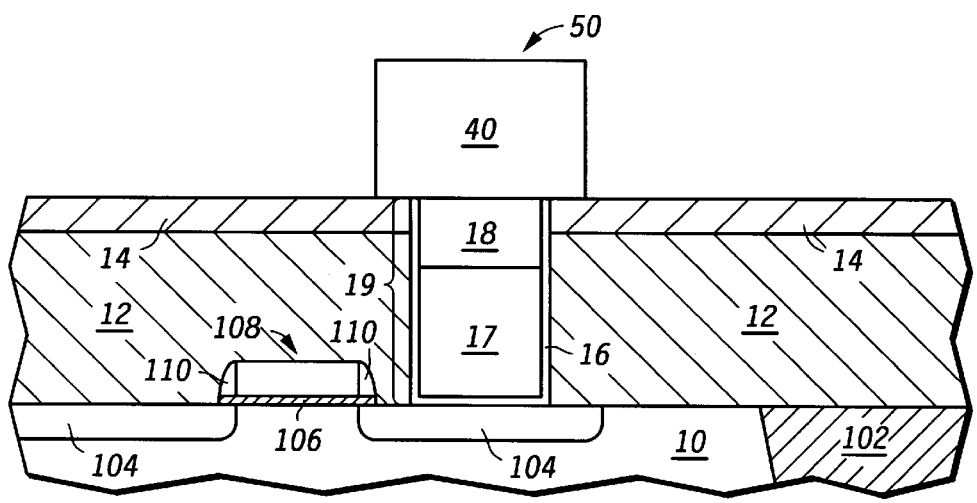

Following the etch or CMP processing to define the lower electrode 40, portions of the dielectric layer 20 are removed to substantially form the post electrode structure 50 shown in FIG. 5. The removal of the dielectric layer 20 is accomplished using a conventional plasma or wet chemical dielectric etch process that has adequate selectivity to the lower electrode 40 and to the etch stop/hardmask layer 14. This is typically accomplished using conventional fluorine-containing etchants.

Figure 6:
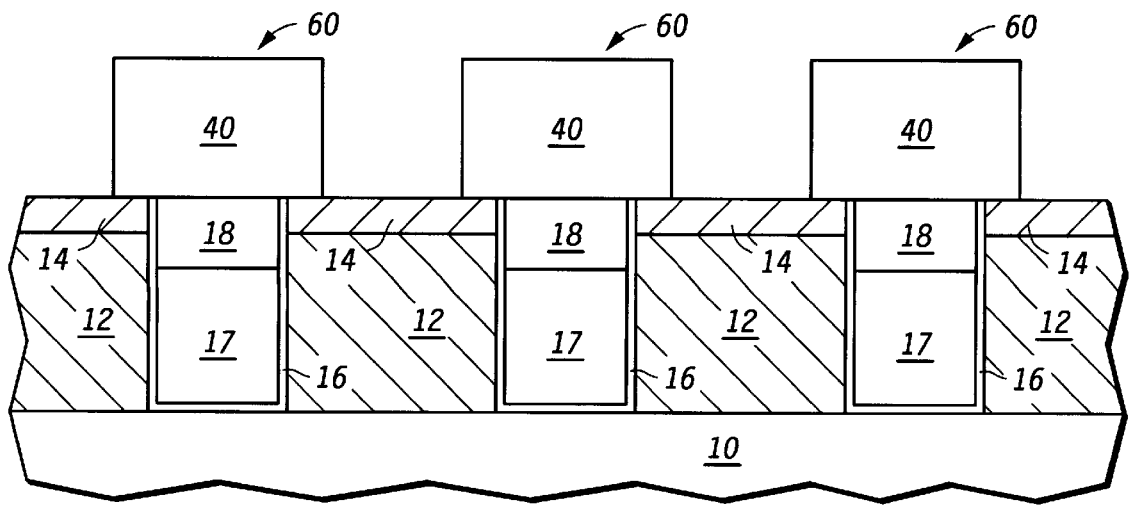

For the purposes of demonstration and clarity of understanding, only one post electrode structure 50 is shown in FIG. 5. FIG. 6 further illustrates a view of the semiconductor device of FIG. 5, from a different perspective, and shows that multiple post electrode structures 60 can be formed using embodiments of the present invention. FIG. 6 additionally illustrates that the aspect ratio of the openings between adjacent electrode post structures can exceed 1:1 and often exceeds 1.5:1 when using embodiments of the present invention. For the purposes of this specification, the aspect ratio of an opening is defined as a ratio of the height of the opening relative to the width of the opening. Therefore, in accordance with one embodiment of the present invention, the thickness and shape of the electrodes and the spacing between adjacent electrodes are not necessarily constrained by limitations associated with prior art methods of etching the electrode material. Rather the thickness, shape and spacing between electrodes is determined by dielectric etch processes, which are conventional to those of ordinary skill in the art.

Figure 7:
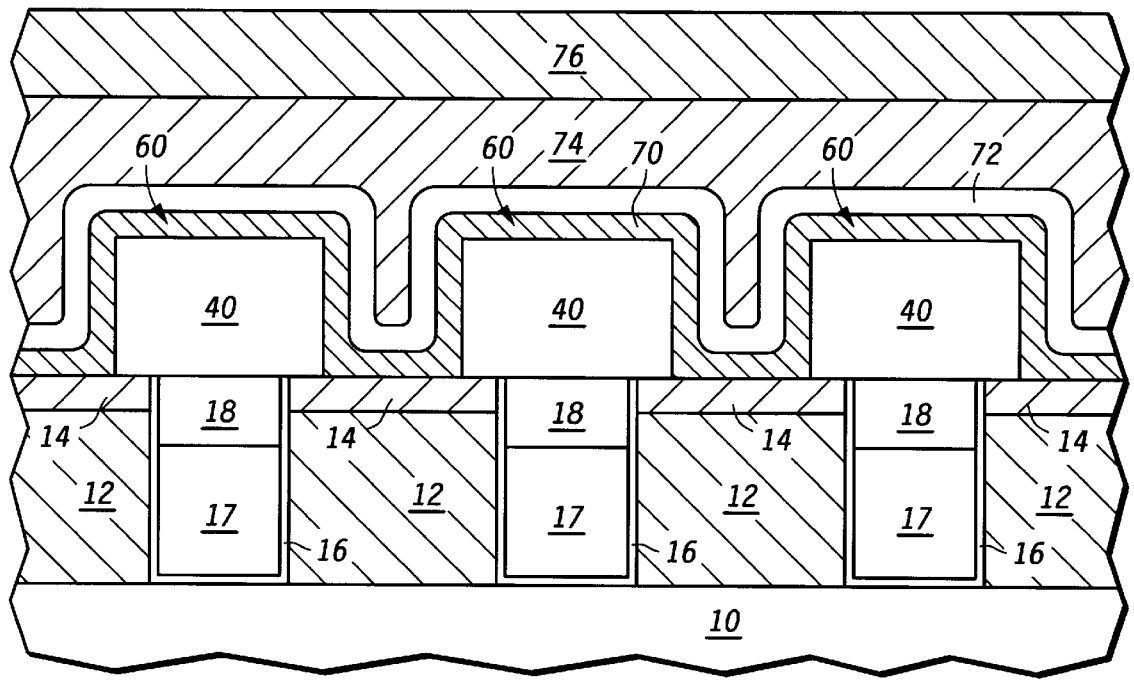

FIG. 7 illustrates the cross-section shown in FIG. 6 and further includes elements that substantially form capacitors. Overlying etch stop/hardmask layer 14 and the post electrode structures 60 is a capacitor dielectric film 70. In one embodiment, the capacitor dielectric film 70 is a high-k dielectric material formed using deposition methods that can include CVD, PVD, or the like. For the purposes of this specification, a high-k dielectric material is a dielectric material having a dielectric constant greater than approximately 10.0. In one embodiment the capacitor dielectric is formed using barium strontium titanate (BST). Alternatively, the capacitor dielectric film 70 can include barium titanate (BTO), strontium titanate (STO), lead titanate (PT), lead zirconate (PZ), lead zirconate titanate (PZT), lead lanthanum zirconate titanate (PLZT), strontium bismuth tantalate (SBT), strontium bismuth niobate (SBN), or strontium bismuth niobate tantalate (SBNT). For DRAM applications, the capacitor dielectric film 70 can include atoms of barium, strontium, or titanium.

Overlying the capacitor dielectric film 70 is a conductive film 72. Conductive film 72 forms the upper capacitor electrode. The conductive film 72 is formed using deposition processes and materials similar to those described previously to form the conductive film 30. The conductive films 30 and 72 can include the same or different conductive materials. Overlying conductive film 72 is a dielectric layer 74 and overlying dielectric layer 74 is a passivation layer 76.

Figure 8:
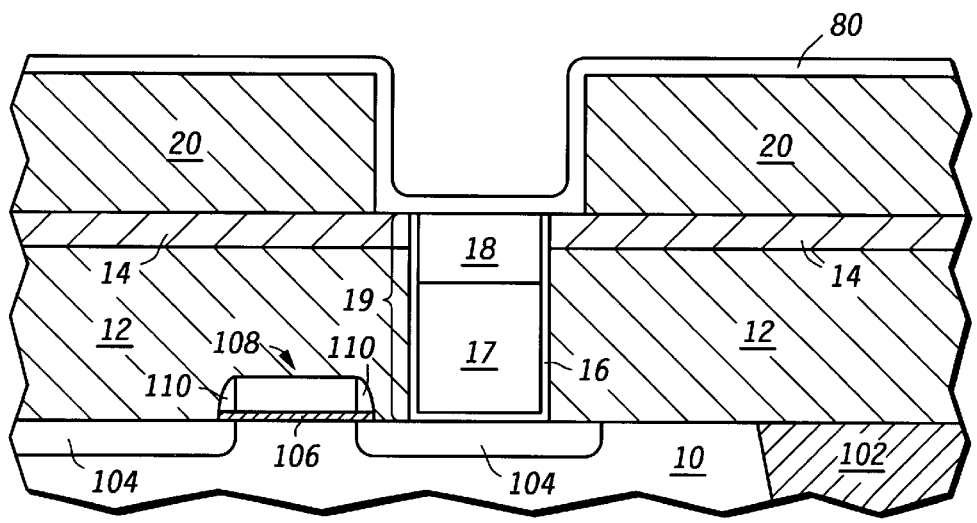
FIGS. 8–11 include illustrations of cross-sectional views of a semiconductor device in accordance with a second set of embodiments.

FIGS. 8–11, illustrate an alternative embodiment in which a crown capacitor electrode structure is formed. FIG. 8 illustrates a stage in the process flow following the stage illustrated in FIG. 2. However, rather than blanket depositing a conductive layer to completely fill the opening 22, a conductive film 80 is deposited to only partially fill the opening 22, as illustrated in FIG. 8. In accordance with one embodiment, the thickness of the conductive film 80 is approximately 15–50% of the thickness of the dielectric layer 20. The conductive film 80 is formed using deposition processes and materials similar to those described previously to form the conductive film 30. Although not necessarily a requirement, it may be advantageous to deposit the conductive film 80 as a conformal layer within the opening.

Figure 9:
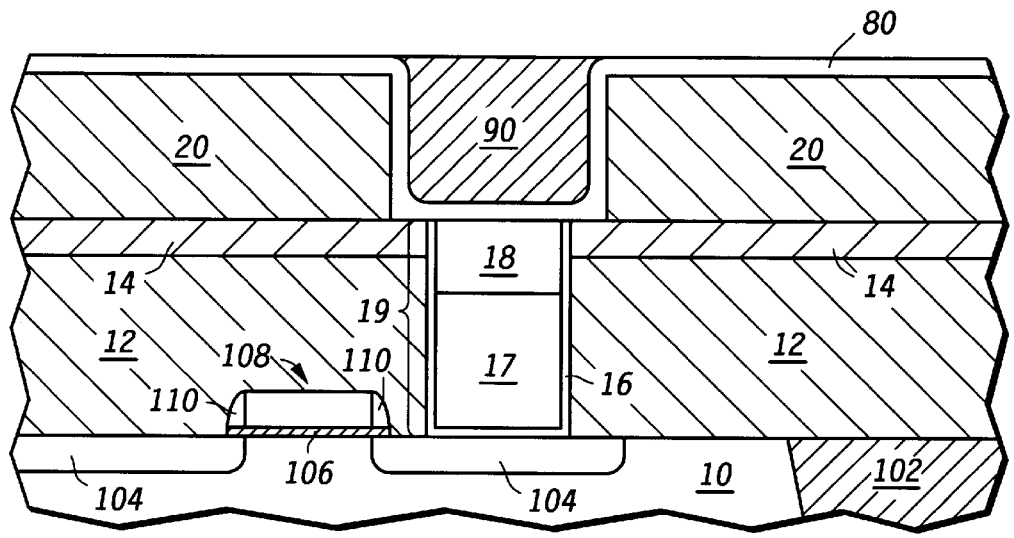
Figure 10:
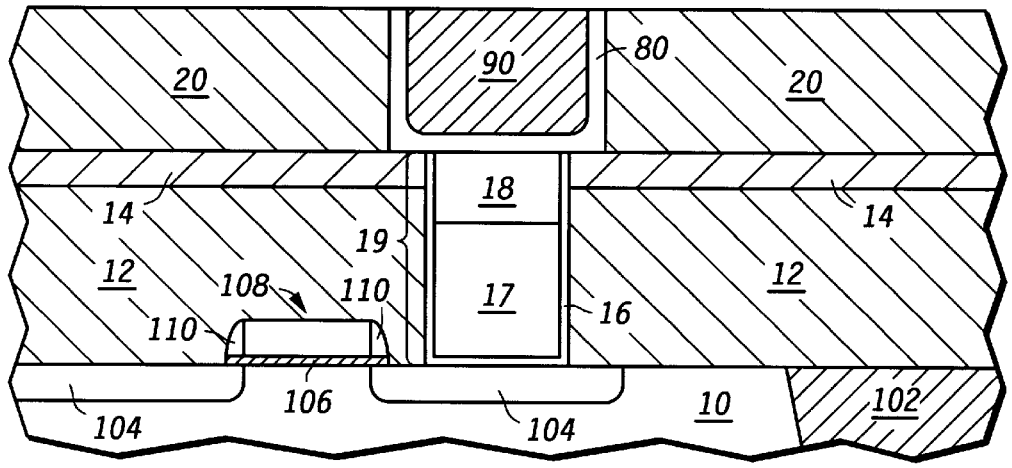
Figure 11:
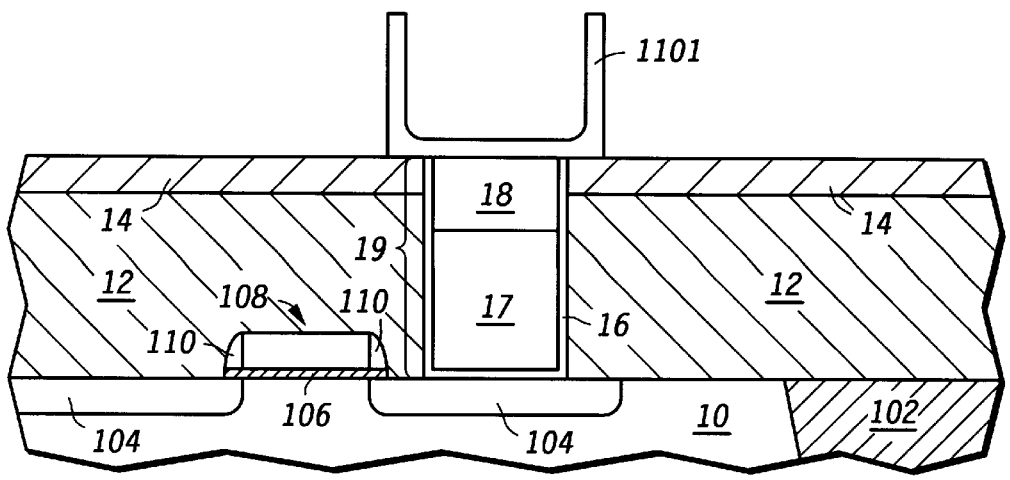

In FIG. 9, a dielectric layer 90 is blanket deposited over the semiconductor substrate 10 to completely fill the opening 22. The dielectric layer 90 can be deposited using processes and materials similar to those described previously to form dielectric layer 20. After depositing the dielectric layer 90, portions of the dielectric layer 90 and conductive film 80 are removed either by CMP, etch back, or a combination of the two, as shown in FIG. 10. The remaining portions of the dielectric layer 90 and the dielectric layer 20 can then be removed, using conventional dielectric etch processes that have adequate selectivity to the conductive film 80 and the etch stop/hardmask layer 14 to substantially form the crown electrode structure 1101, as shown in FIG. 11. Processing then continues in a manner similar to that described in FIG. 7 to form a substantially completed semiconductor device structure.

Figure 12:
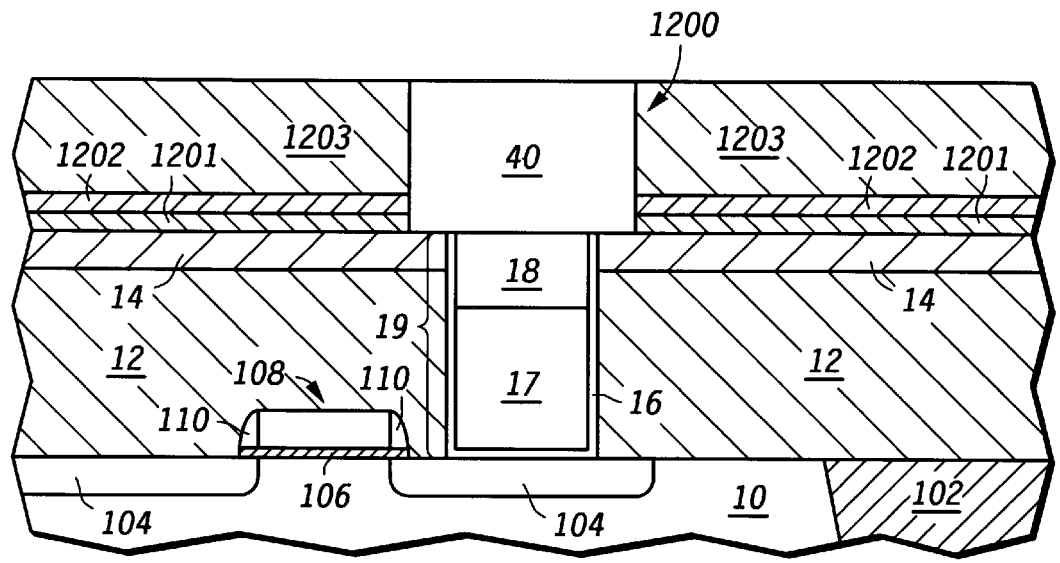
FIGS. 12 and 13 include illustrations of cross-sectional views of a semiconductor device in accordance with yet a third set of embodiments, which is a modification of the embodiments shown in FIGS. 1–7.

FIG. 12 illustrates a modification to the embodiments described in connection with FIGS. 1–7. However, in this embodiment, instead of forming the dielectric layer 20 over the etch stop/hardmask layer 14, an anchor layer 1201, a second etch stop layer 1202, and a dielectric layer 1203 are all sequentially formed over the hardmask layer 14. The anchor layer 1201 includes a silicon oxide material, the second etch stop layer 1202 includes a silicon nitride or silicon oxynitride material, and the dielectric layer 1203 includes materials similar to those used to form dielectric layer 20, as described in FIG. 2.

Figure 13:
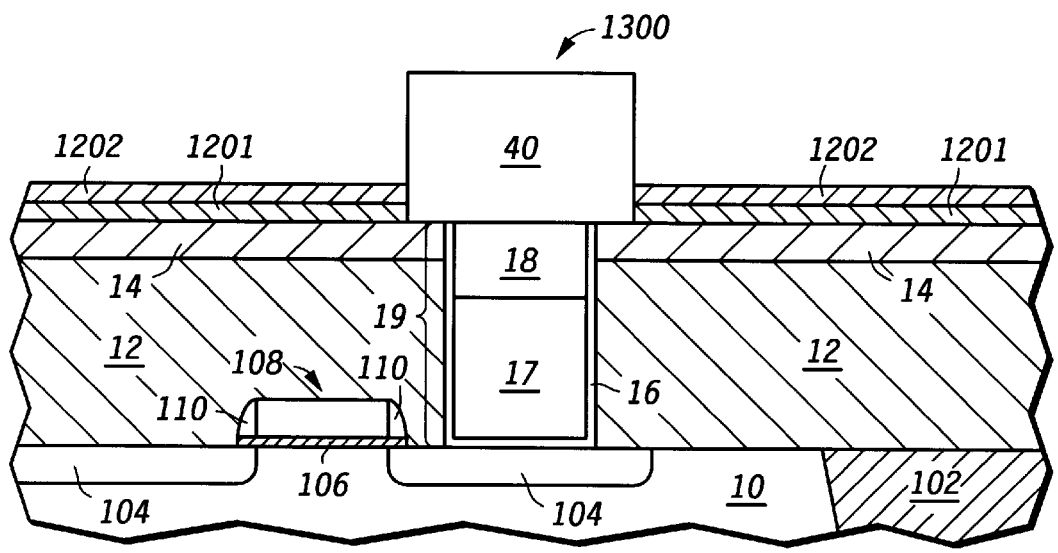

After forming the dielectric layer 1203, an opening 1200 is formed using conventional patterning and etching processes. The opening 1200 extends through the dielectric layer 1203, the etch stop layer 1202, and anchor layer 1201. After forming the opening 1200, a conductive material is deposited to fill the opening and then planarized to define a lower electrode 40, as shown in FIG. 12. The dielectric layer 1203 is then removed to form the post electrode structure 1300, illustrated in FIG. 13. In this embodiment, the anchor layer 1201 provides benefits that include providing additional support of the electrode 1300, wherein delamination and adhesion problems of the electrode with respect to underlying surfaces is reduced. In addition, the anchor layer 1201 provides an additional level of oxygen barrier protection by increasing the distance that oxygen must diffuse to oxidize the conductive fill material 17 during high-temperature oxygen anneals, thereby further preventing unwanted oxidation of the conductive fill material 17.

In yet another alternative embodiment, instead of forming a conductive plug using the conductive fill and oxygen barrier materials and then separately forming the electrode using a conductive film, as described in FIGS. 1–4, the plug and electrode can be formed simultaneously using a same conductive material. In this manner, the oxidation problems associated with the conductive fill material are eliminated and the number of deposition and planarization processes is reduced. This is can be accomplished using any combination of via-first trench-last or via-last trench-first processing methodologies commonly associated with dual-inlaid trench formation. In one specific embodiment, this is accomplished by first forming a lower dielectric layer and etch/stop hardmask layer similar to the dielectric layer 12 and etch stop/hardmask layer 14 described previously in FIG. 1. Then instead of forming a plug, such as the plug 19, an upper dielectric layer similar to the dielectric layer 20 in FIG. 2 is deposited over the etch stop/hardmask layer 14. The upper dielectric layer is then patterned and etched to form a first opening that will be used to define a plug portion of a composite plug/electrode structure. The first opening is etched to extend through the etch stop/hardmask layer, thereby defining a pattern in the etch stop/hardmask layer and exposing portions of the lower dielectric layer.

The substrate is then cleaned of residual patterning material, i.e. resist, and re-patterned to define a second opening, overlying the first opening, in the upper dielectric layer. The pattern of the second opening defines the electrode portion of the composite plug/electrode structure and the pattern of the first opening, in the etch stop/hardmask layer, defines the plug portion of the composite plug/electrode structure. The substrate is then etched, using the two patterns, to simultaneously form the electrode and plug openings for the subsequently formed composite plug/electrode structure. A conductive film similar to the conductive film 30 (shown in FIG. 3) is then deposited over the substrate to completely fill the electrode/plug opening. Portions of the conductive film are then polished back and portions of the dielectric layer overlying the etch stop/hard mask layer are removed, using processes similar to those described in FIGS. 4 and 5, to substantially form the composite electrode/plug structure.

In yet another embodiment, a plug, similar to the plug 19 shown in FIG. 1, is formed without the conductive oxygen barrier material 18. After forming the plug without the oxygen barrier, a dielectric layer, similar to dielectric layer 20 shown in FIG. 2, is formed over the plug. Then, after forming an opening similar to opening 22, an additional etch is performed to remove approximately 100–250 nm of plug material from the uppermost portions of the plug, thereby recessing portions of the plug. In this embodiment, the recessed plug is formed at a later stage in the process as compared to the previous embodiments. A conductive film, similar to the conductive film 30 in FIG. 3, is then deposited within the opening and within the recess. In this manner, those portions of the conductive film that are formed within the recess provide the oxygen barrier protection previously provided by the conductive oxygen barrier material 18 shown in FIGS. 1–12. This embodiment provides the advantage of eliminating the processing steps necessary for forming the conductive oxygen barrier material 18.

Methods for depositing and etching dielectrics are known in the art. The present inventors have recognized that these methods can advantageously be used to form conductive structures, such as capacitor electrodes and the like. Using embodiments of the present invention, the surface area of a capacitor electrode and spacing between multiple capacitor electrodes is selectively and accurately controlled. This is accomplished by first depositing a specific thickness of dielectric, patterning and etching openings within the dielectric, forming a conductive material within the openings, and then removing the dielectric, thereby forming the capacitor electrodes. The dimensions of the capacitor electrodes correspond to the dimensions of the openings in the dielectric.

The capacitor electrodes are formed without using the problematic patterning and etching processes required by the prior art. Furthermore, the spacing between adjacent electrodes can be increasingly scaled without incurring the etch-related problems commonly associated with increasing aspect ratios between conductive features. In addition, embodiments described herein can be integrated into an existing process flow without a need to use exotic materials, develop new processes, or purchase new processing equipment. Thus it is apparent that there has been provided, in accordance with embodiments of the present invention, a process for forming an electrode structure that provides advantages over the prior art.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of forming a semiconductor device comprising:

forming a first etch stop layer over a substrate;

forming a first dielectric layer over the first etch stop layer;

forming a second etch stop layer over the first dielectric layer;

forming an second dielectric layer over the second etch stop layer;

forming an opening extending through the second dielectric layer, the second etch stop layer, and the first dielectric layer and exposing a conductive plug;

forming a second conductive material over the substrate and within the opening, wherein the conductive material contacts the conductive plug;

removing portions of the conductive material lying outside of the opening; and removing portions of the second dielectric layer to expose portions of the first etch stop layer and define a capacitor electrode.

2. The method of claim 1, further comprising:

forming a second dielectric layer over a remaining portion of the second conductive material;

forming a third conductive material over the second dielectric layer;

forming a third dielectric layer over the third conductive material; and forming a passivation layer over the third dielectric layer.

3. The method of claim 2, wherein the semiconductor device comprises a capacitor that includes the second conductive material, the second dielectric layer, and the third conductive material.

4. The method of claim 3, further comprising a transistor, wherein the first conductive material electrically connects the capacitor and the transistor.

5. The method of claim 1, wherein the second conductive material includes iridium.

6. The method of claim 1, wherein the second conductive material comprises a material selected from the group consisting of platinum, palladium, ruthenium, rhenium, rhodium, osmium, ruthenium oxide, rhenium oxide, iridium oxide, osmium oxide, strontium ruthenate, lanthanum strontium cobalt oxide, and yttrium barium copper oxide.

7. The method of claim 1, further comprising:

forming a second dielectric layer over the substrate, wherein the second dielectric layer is formed before forming the first etch stop layer; and forming a conductive plug in the second dielectric layer, wherein the conductive plug includes the first conductive material.

8. The method of claim 1, wherein the first conductive material comprises an oxygen barrier material.

9. The method of claim 8, wherein the oxygen barrier material includes iridium.

10. The method of claim 8, wherein the oxygen barrier material comprises a material selected from the group consisting of ruthenium, iridium oxide, ruthenium oxide, titanium nitride, titanium aluminum nitride, titanium silicon nitride, tantalum nitride, tantalum aluminum nitride, tantalum silicon nitride, metal nitrides, metal borides, and metal carbides.

11. The method of claim 1, wherein the first etch stop layer comprises a material selected from the group consisting of silicon nitride and silicon oxynitride.

12. The method of claim 1, wherein the second conductive material is formed using a process that includes physical vapor deposition.

13. The method of claim 1, wherein the second conductive material completely fills the opening, and wherein a post structure is formed following removing portions of the first dielectric layer.

14. The method of claim 1, wherein the second conductive material partially fills the opening, and wherein a crown structure is formed following removing portions of the first dielectric layer.

15. A method of forming a semiconductor device comprising:

forming an etch stop layer over a substrate;

forming a first dielectric layer over the etch stop layer;

forming a first opening and a second opening in the first dielectric layer, wherein the first opening is spaced apart from the second opening, and wherein the first opening and the second opening expose portions of an oxygen barrier within a conductive plug region of a semiconductor device;

forming a first conductive material over the first dielectric layer and within the first opening and the second opening, wherein the first conductive material completely fills the first and second opening;

removing portions of the first conductive material lying outside of the first opening and the second opening; and removing portions of the first dielectric layer to expose portions of the etch stop layer and define a first and second post capacitor electrode structure.

16. The method of claim 15, wherein a first remaining portion of the first conductive material defined by the first opening includes a first electrode and a second remaining portion of the first conductive material defined by the second opening includes a second electrode.

17. The method of claim 16, wherein an aspect ratio between the first electrode and the second electrode is greater than approximately 1:1.

* * * * *